United States Patent
Miyagawa

(10) Patent No.: US 8,815,726 B2
(45) Date of Patent: Aug. 26, 2014

(54) METHOD OF MANUFACTURING SEMICONDUCTOR DEVICE

(75) Inventor: Osamu Miyagawa, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 13/164,479

(22) Filed: Jun. 20, 2011

(65) Prior Publication Data

US 2011/0244672 A1    Oct. 6, 2011

Related U.S. Application Data

(62) Division of application No. 11/869,276, filed on Oct. 9, 2007, now Pat. No. 7,989,331.

(30) Foreign Application Priority Data

Oct. 10, 2006  (JP) ................. 2006-276383

(51) Int. Cl.
*H01L 21/00* (2006.01)
*H01L 21/3213* (2006.01)
*H01L 27/105* (2006.01)
*H01L 27/115* (2006.01)

(52) U.S. Cl.
CPC ........ *H01L 21/32137* (2013.01); *H01L 27/105* (2013.01); *H01L 27/115* (2013.01); *H01L 27/11526* (2013.01); *H01L 27/11529* (2013.01); *H01L 27/11543* (2013.01)
USPC .............................. 438/585; 438/591; 438/689

(58) Field of Classification Search
CPC ................... H01L 21/32136; H01L 21/32137; H01L 21/3065
USPC ........................................ 438/585, 591, 689
See application file for complete search history.

(56) References Cited

U.S. PATENT DOCUMENTS

| 5,387,556 | A | 2/1995 | Xiaobing et al. |
| 5,846,443 | A | 12/1998 | Abraham |
| 6,194,284 | B1 | 2/2001 | Chen |
| 6,491,835 | B1 * | 12/2002 | Kumar et al. .................. 216/51 |
| 6,500,727 | B1 | 12/2002 | Chen et al. |
| 6,531,349 | B2 | 3/2003 | Yoshida et al. |
| 6,653,237 | B2 | 11/2003 | Deshmukh et al. |

(Continued)

FOREIGN PATENT DOCUMENTS

| JP | 2-90521 | 3/1990 |
| JP | 2004-64020 | 2/2004 |
| JP | 2005-268292 | 9/2005 |
| JP | 2006-86486 | 3/2006 |

OTHER PUBLICATIONS

Japanese Office Action issued Nov. 8, 2011 in patent application No. 2006-276383 with English translation.

*Primary Examiner* — Laura Menz
(74) *Attorney, Agent, or Firm* — Oblon, Spivak, McClelland, Maier & Neustadt, L.L.P.

(57) ABSTRACT

A method of manufacturing a semiconductor device including forming a mask layer on a polycrystalline silicon film formed on a semiconductor substrate via an insulating film; forming a dense pattern and a sparse pattern on the mask layer to form a mask; etching the polycrystalline silicon film with the mask by controlling a temperature of the semiconductor substrate placed in an etching chamber at 50 degrees Celsius or higher, supplying an etching gas composed of a hydrogen bromide containing gas and a fluoromethane based gas into the chamber, and generating plasma in the chamber.

6 Claims, 10 Drawing Sheets

(56) References Cited

U.S. PATENT DOCUMENTS

| | | |
|---|---|---|
| 6,709,984 B2 | 3/2004 | Saito et al. |
| 6,784,110 B2 | 8/2004 | Wen et al. |
| 7,259,067 B2 | 8/2007 | Yang |
| 7,312,158 B2 | 12/2007 | Miyagawa et al. |
| 2001/0036732 A1 | 11/2001 | Yoshida et al. |
| 2002/0115276 A1 | 8/2002 | Yoshida et al. |
| 2003/0003752 A1 | 1/2003 | Deshmukh et al. |
| 2005/0095784 A1 | 5/2005 | Yang |
| 2005/0215062 A1 | 9/2005 | Miyagawa et al. |
| 2006/0216938 A1 | 9/2006 | Miyagawa et al. |
| 2007/0184657 A1* | 8/2007 | Iijima et al. ............... 438/689 |
| 2008/0085593 A1 | 4/2008 | Miyagawa |
| 2008/0230519 A1 | 9/2008 | Takahashi |

\* cited by examiner

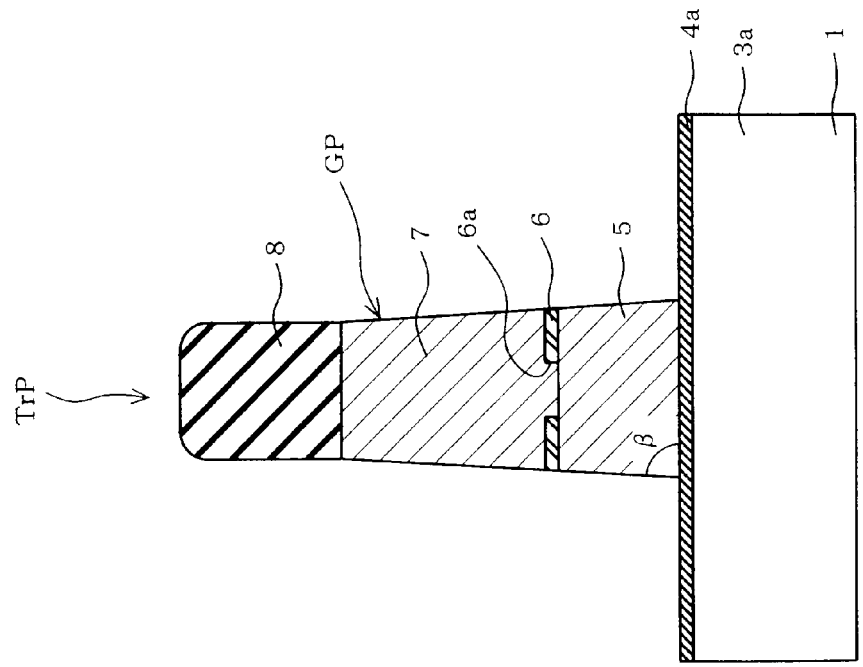
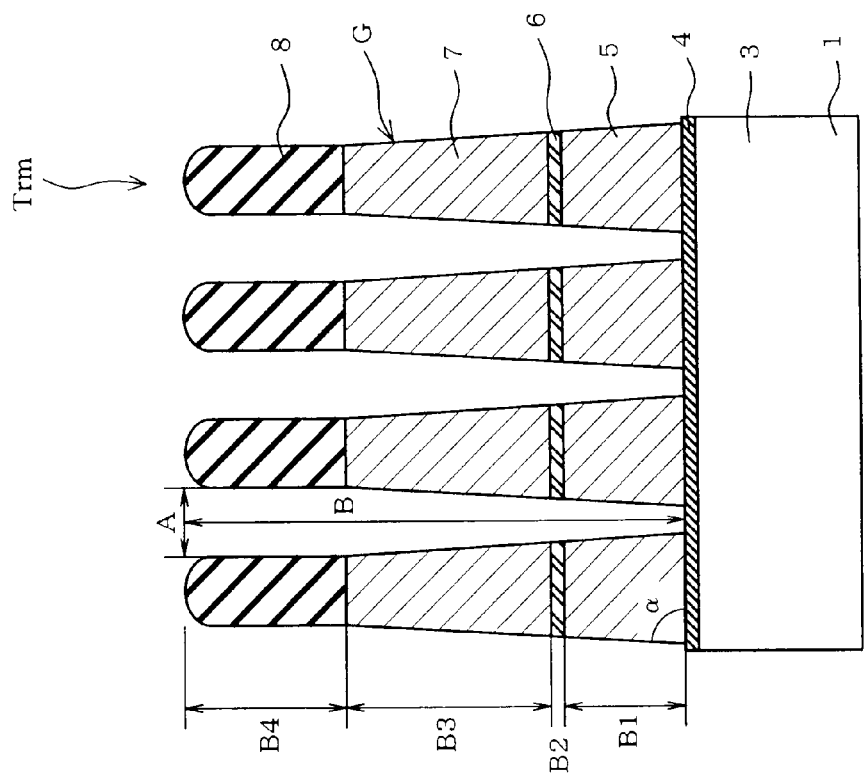
FIG. 3A
FIG. 3B

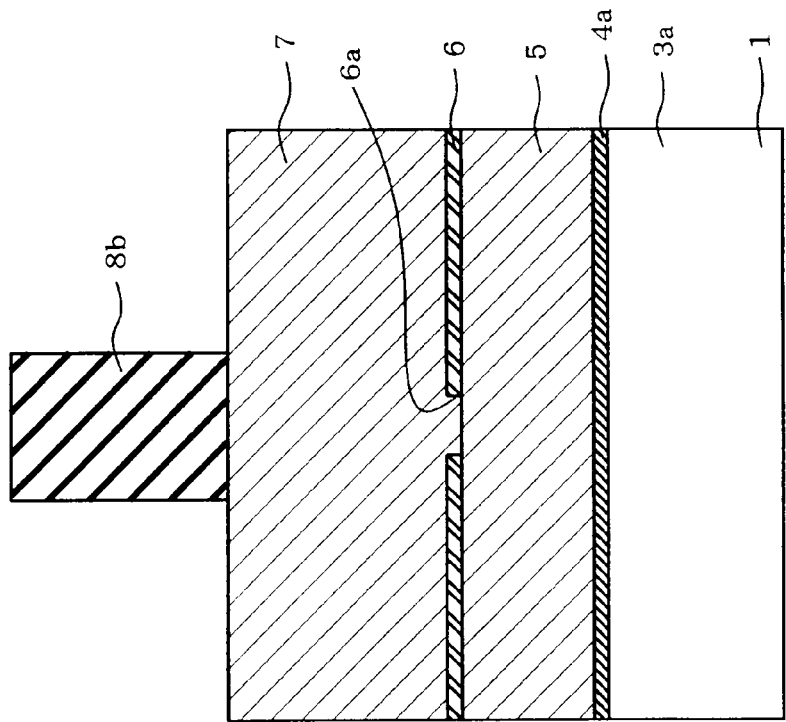
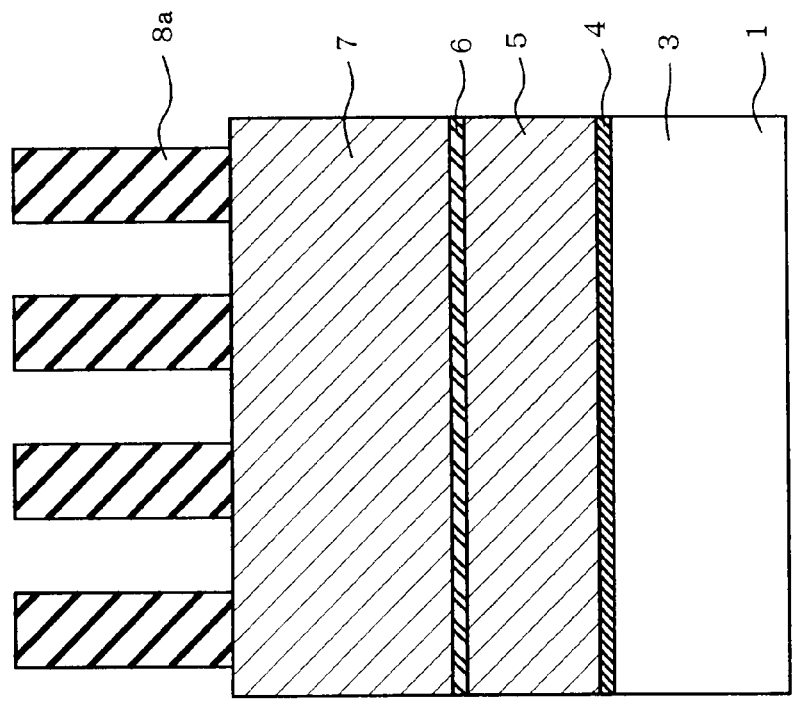
FIG. 5A
FIG. 5B

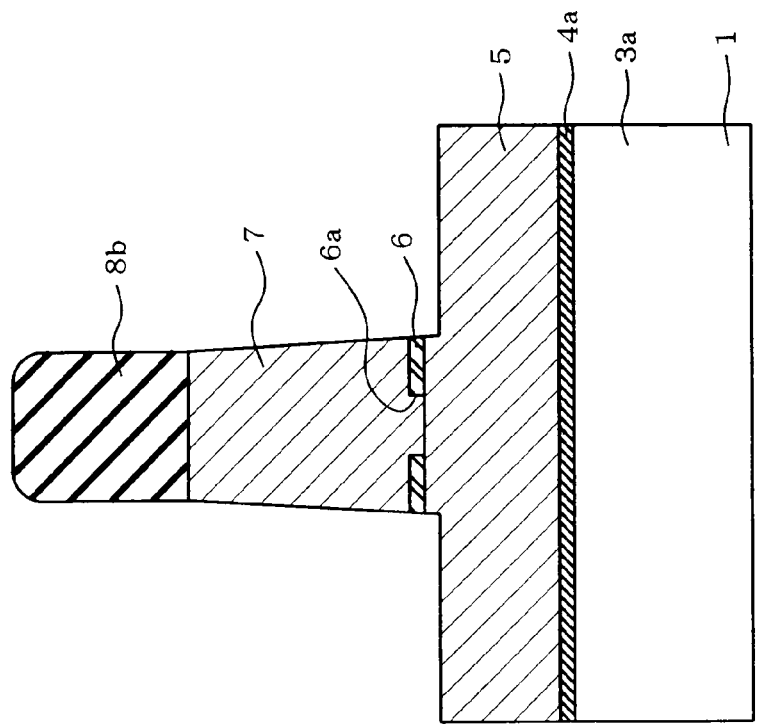
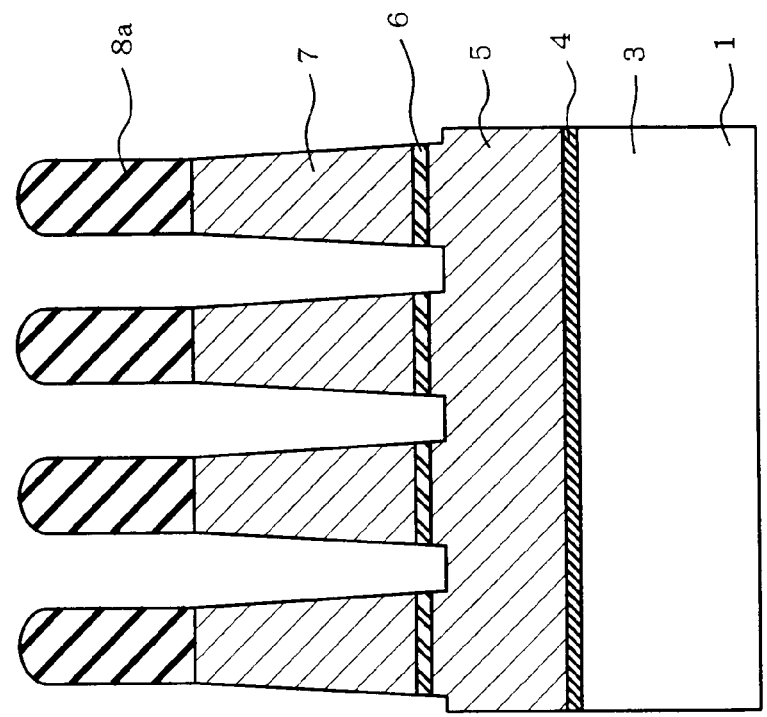

US 8,815,726 B2

METHOD OF MANUFACTURING SEMICONDUCTOR DEVICE

CROSS-REFERENCE TO RELATED APPLICATIONS

This application is a division of and claims the benefit of priority under 35 U.S.C. §120 from U.S. Ser. No. 11/869,276 filed Oct. 9, 2007, and claims the benefit of priority under 35 U.S.C. §119 from Japanese Patent Application No. 2006-276383 filed Oct. 10, 2006, the entire contents of each of which are incorporated herein by reference.

FIELD

The present disclosure is directed to a method of manufacturing a semiconductor device including a polycrystalline silicon film having a dense pattern and a sparse pattern formed on a semiconductor substrate.

BACKGROUND

One method of densely patterning a polycrystalline film containing layer overlying a semiconductor substrate is disclosed for example in JP 2005-268292 A. The method performs RIE (reactive ion etching) with a mixture of hydrogen bromide (HBr) and additive gases such as chlorine gas ($Cl_2$) or oxygen gas ($O_2$). Nitrogen gas ($N_2$) may also be employed as additive gas other than chlorine gas ($Cl_2$) or oxygen gas ($O_2$).

In semiconductor devices primarily configured by logical circuits, there is little variation in pattern density within the chip, thus, little variation is observed in the etching results originating from the variation in pattern density when etched under the above described conditions. However, in semiconductor devices such as NAND flash memory typically configured by a memory cell region having a dense pattern with close-spacing and a peripheral circuit region having a sparse-pattern with wide-spacing, the above described RIE produces varying etching results originating from the variation in pattern density.

More specifically, when etching the densely patterned memory cell region configured at L/S (Line and Space) of 1:1, and the sparsely patterned peripheral circuit region simultaneously, the deposit (reactive product) of silicon bromide (SiBr) causes variation in the etching result in the dense pattern and the sparse pattern. For instance, in the sparsely-patterned region, increased amount of reactive product is deposited in the widely spaced gate structures, resulting in increased width in the lower portion of the gate structures.

SUMMARY

The present disclosure provides a method of manufacturing a semiconductor device with reduced variation in etch results originating from variation in pattern density even when a dense pattern and a sparse pattern co-exist when etching a polycrystalline silicon film formed on an insulating film overlying the semiconductor substrate.

The method of manufacturing a semiconductor device of the present disclosure includes forming a mask layer on a polycrystalline silicon film formed on a semiconductor substrate via an insulating film; forming a dense pattern and a sparse pattern on the mask layer to form a mask; etching the polycrystalline silicon film with the mask by controlling a temperature of the semiconductor substrate placed in an etching chamber at 50 degrees Celsius or higher, supplying an etching gas composed of a hydrogen bromide containing gas and a fluoromethane based gas into the chamber, and generating plasma in the chamber.

BRIEF DESCRIPTION OF THE DRAWINGS

Other objects, features and advantages of the present disclosure will become clear upon reviewing the following description of the embodiment of the present disclosure with reference to the accompanying drawings, in which.

FIGS. 3A and 3B are cross sectional views of portions taken along lines 3A-3A and 3B-3B of FIGS. 2A and 2B;

FIGS. 5A and 5B are schematic cross sectional views showing one phase of a manufacturing step ($2^{nd}$ variation);

FIGS. 7A and 7B are schematic cross sectional views showing one phase of a manufacturing step ($4^{th}$ variation);

DETAILED DESCRIPTION

One embodiment employing the present disclosure to a NAND flash memory will be described with reference to FIGS. 1 to 10. References are made to the drawings hereinafter with identical or similar reference symbols when referring to identical or similar elements. Of note is that the drawings are merely schematic and the relation between thickness and planar dimensions and thickness ratios between the different layers vary from the actual ratio.

A description will be given on the configuration of the NAND flash memory of the present embodiment.

Figure 1:
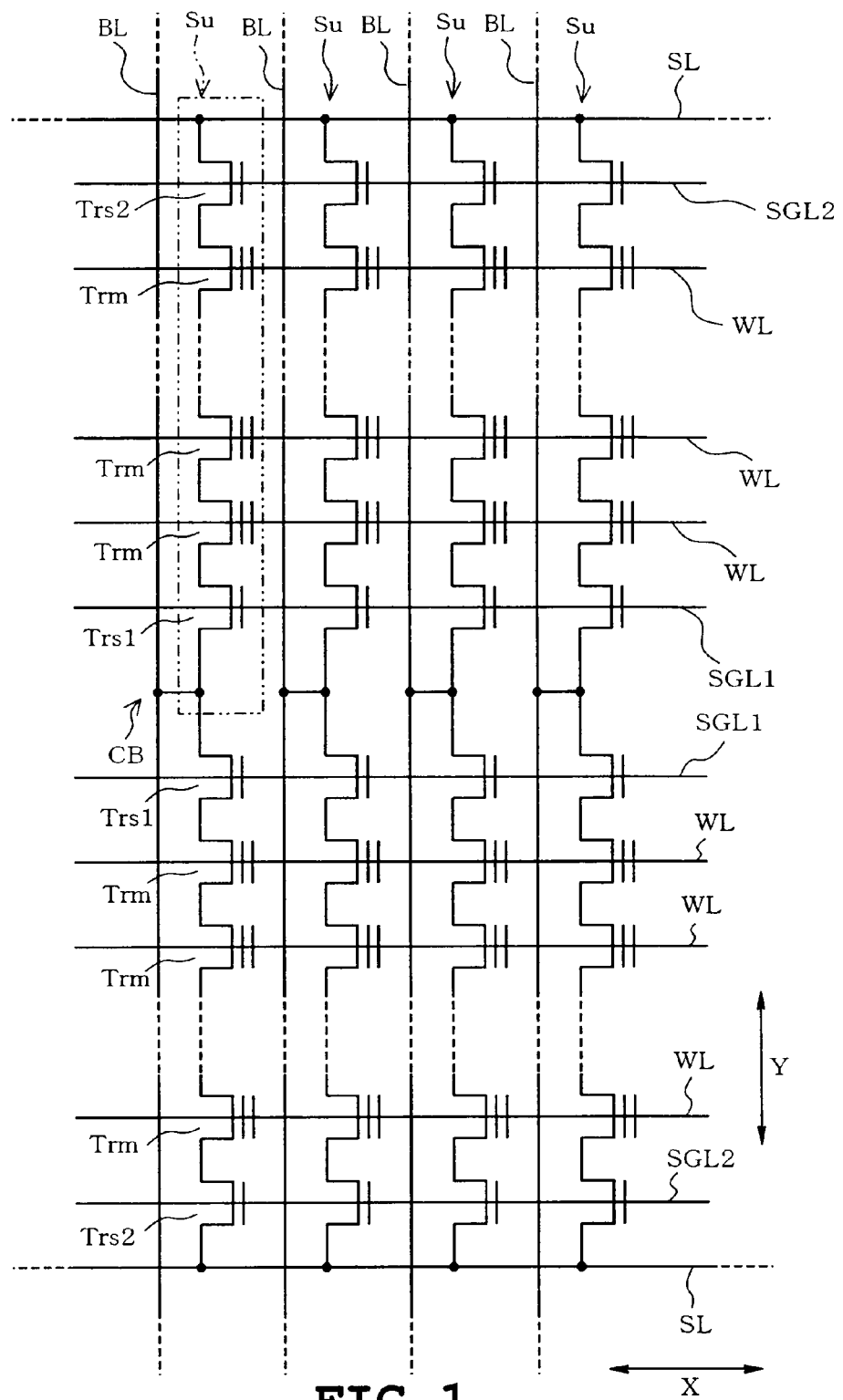
FIG. 1 illustrates an equivalent circuit showing a portion of the a memory cell array of a NAND type flash memory indicating one embodiment of the present disclosure.

FIG. 1 illustrates an equivalent circuit indicating a portion of a memory cell array formed in the memory cell region of the NAND flash memory.

The memory cell array of the NAND flash memory is configured by a matrix of NAND cell units SU. The NAND cell unit SU is constituted by two select gate transistors Trs, and a plurality (eight for example: nth power of 2 (n is a positive integer)) of memory cell transistors Trm connected in series to the two select gate transistors Trs. The plurality of neighboring memory cell transistors Trm shares source/drain regions within a single NAND cell unit SU.

Referring to FIG. 1, the memory cell transistors Trm aligned in an X-direction (corresponding to word line direction and gate width direction) are connected to a common word line (control gate line) WL. Also, the select gate transistors Trs1 aligned in the X-direction in FIG. 1 are connected to a common select gate line SGL1. The select gate transistors Trs2 are connected to a common select gate line SGL2. A bit line contact CB is connected to a drain region of the select gate transistor Trs1. The bit line contact CB is connected to a bit line BL extending in the Y-direction (corresponding to the gate length direction and the bit line direction) perpendicularly crossing over the X-direction indicated in FIG. 1. The select gate transistor Trs2 is connected to a source line SL extending in the X direction of FIG. 1 via the source region.

Figure 2B:
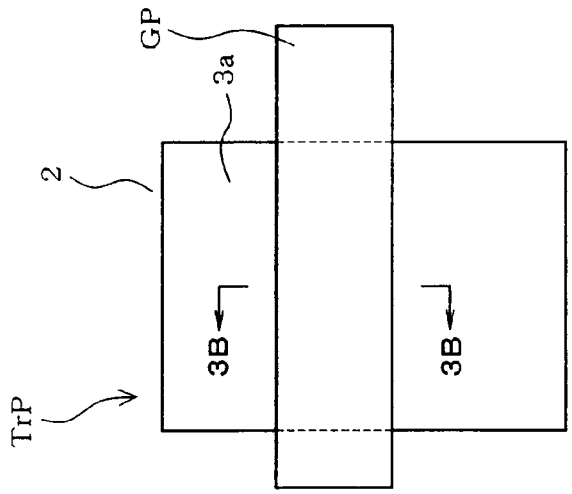
FIGS. 2A and 2B are schematic plan views indicating partial layouts of transistors of a memory cell region and a peripheral circuit region.
Figure 2A:
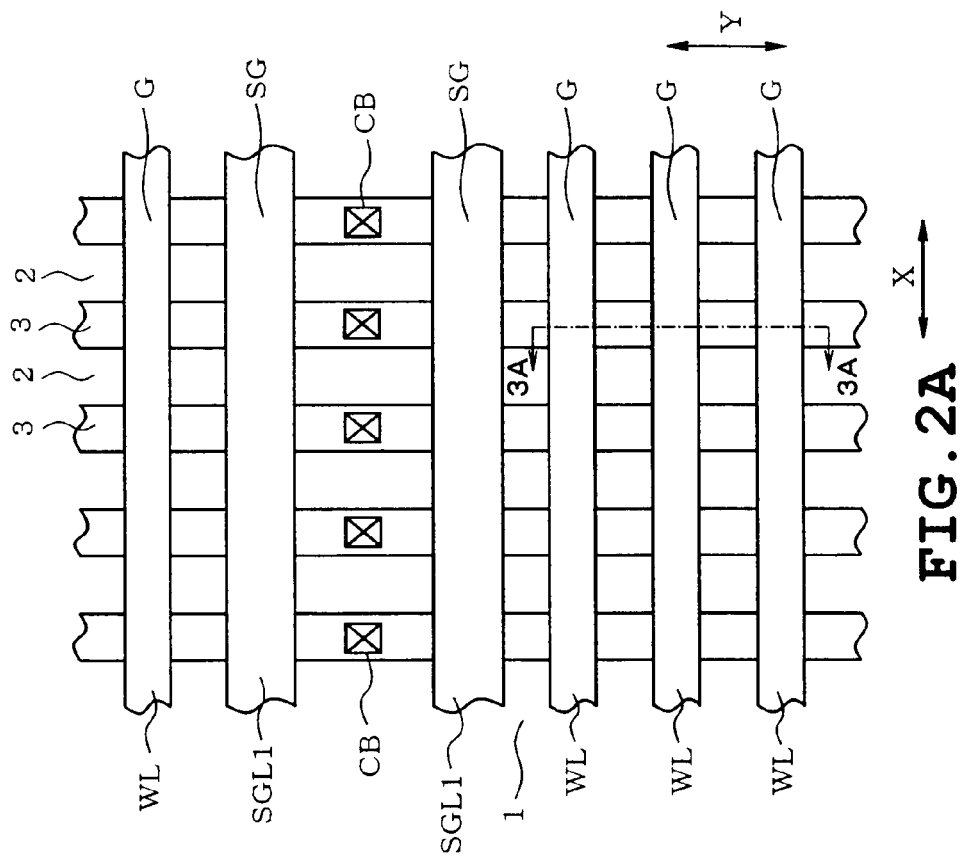

FIG. 2A is a plan view indicating a layout of a portion of the memory cell region. FIG. 2B is a plan view of a high-voltage transistor or a low-voltage transistor in the peripheral circuit region. A plurality of STIs 2 (shallow trench isolation) serving as an element isolation region is formed at predetermined intervals along the Y-direction as viewed in FIG. 2A to form active regions 3 in the X-direction as viewed in FIG. 2A. Word lines WL of memory cell transistors are formed at predetermined intervals along the X-direction as viewed in FIG. 2A defining a right angle with the active region 3. Also, a select gate line SGL 1 of a pair of select gate transistors are formed along the X-direction as viewed in FIG. 2A. The bit line contacts CB are formed in the active region 3 between the pair of select gate lines SGL1. A gate electrode G of the memory cell transistor is formed at the crossover of the active region 3 and the word line WL, and a gate electrode SG of the select gate transistor is formed at the crossover of the active region 3 and the select gate line SGL 1.

FIG. 2B illustrates the transistor TrP formed in the peripheral circuit region. More specifically, the transistor Trp is formed in the active region 3a surrounded by the STI 2 in a rectangular form. A gate electrode GP is formed so as to transverse the active region 3a and a source/drain region is formed by diffusing impurities at both sides of the gate electrode GP.

FIGS. 3A and 3B are schematic cross sectional views taken along lines 3A-3A and 3B-3B of FIGS. 2A and 2B. FIG. 3A illustrates one phase of the manufacturing steps for forming a gate electrode G of the memory cell transistor Trm provided in the memory cell region. FIG. 3B illustrates one phase of the manufacturing steps for forming the gate electrode GP of the transistor TrP provided in the peripheral circuit region.

Gate electrode G of the memory cell transistor Trm has the closest pattern spacing to constitute a densely patterned portion. Gate electrode GP of the transistor TrP has wider pattern spacing compared to the densely patterned portion to constitute a sparsely patterned portion.

FIGS. 3A and 3B illustrate the gate electrode G and the gate electrode GP formed on a tunnel insulating film 4 serving as a gate insulating film overlying the silicon substrate 1. The gate electrodes G and GP are configured by laminating a polycrystalline silicon film 5 serving as a conductive layer of a floating gate electrode, an inter-gate insulating film 6 composed of ONO (oxide-nitride-oxide) film or NONON (nitride oxide nitride oxide nitride) film, or the like, and a polycrystalline silicon film 7 serving as a conductive layer of a control gate electrode. A silicon nitride film 8 serving as an etch mask is formed on the upper portion of the polycrystalline silicon film 7. The etch mask is not limited to the single layer of silicon nitride film 8, but may employ laminated layers composed of a silicon nitride film, a BSG (boron silicate glass) film, and a TEOS (tetraethyl orthosilicate) film, for example.

Referring to FIG. 3B, the inter-gate insulating film 6 of the gate electrode GP has an opening 6a defined to provide electrical connection between the polycrystalline silicon film 5 and the polycrystalline silicon film 7. The opening 6a is filled with polycrystalline silicon film 7. The peripheral circuit region transistor TrP may be formed with a gate insulating film 4a having a different thickness from the gate insulating film 4 of the memory cell transistor Trm. For example, a thick gate insulating film is formed in a high-voltage transistor and a gate insulating film having the same thickness or reduced thickness relative to the memory cell transistor may be formed in the low-voltage transistor.

Under the above described configuration, the aspect ratio of the memory cell transistor Trm is described as a ratio (B/A) of spacing A between the gate electrodes G and the height B of the gate electrode G as indicated in FIG. 3A. The given dimension is inclusive of the silicon nitride film 8 required in the actual etch process. Height B is a total sum of each film thickness B1 to B4 of the polycrystalline silicon film 5, the inter-gate insulating film 6, the polycrystalline silicon film 7, and the silicon nitride film 8. The aspect ratio (B/A) of the densely patterned memory cell transistor Trm is five or greater.

Also, the variation in the resulting topography originating from the variation of pattern density can be verified by the angle of inclination, in other words, the taper angle of the etched sidewall. As shown in FIGS. 3A and 3B, the taper angle being defined by the sidewall of the polycrystalline silicon film 5 and the surface of the gate oxide film 4 is identified as a taper angle α at gate electrode G and taper angle β at gate electrode GP. Conventionally, the taper angle α was prone to become large and the taper angel β was prone to be small. The present embodiment allows both taper angles α and β to be processed in substantially the same angle.

One example of manufacturing steps for the above described configuration will be given hereinafter.

Figure 4B:
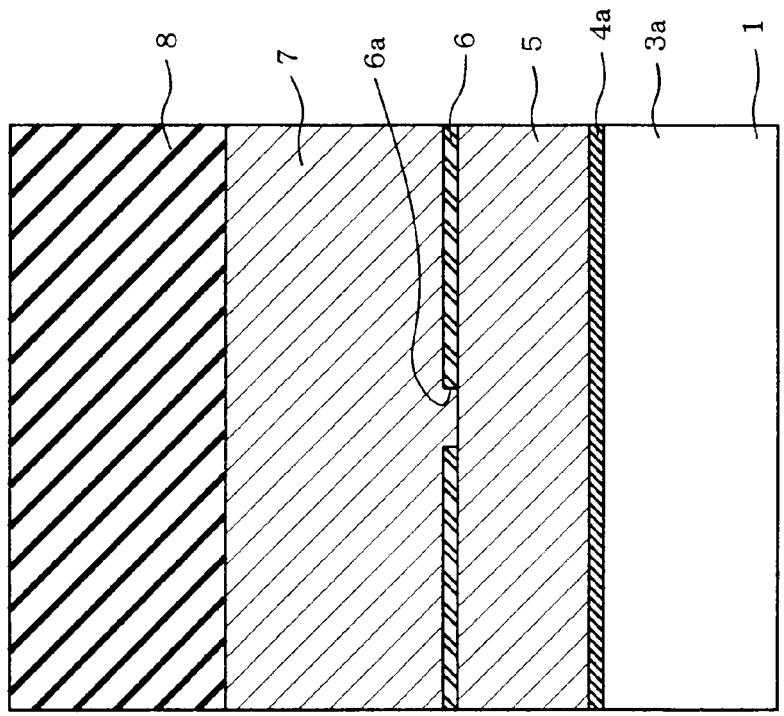
FIGS. 4A and 4B are schematic cross sectional views showing one phase of a manufacturing step.
Figure 4A:
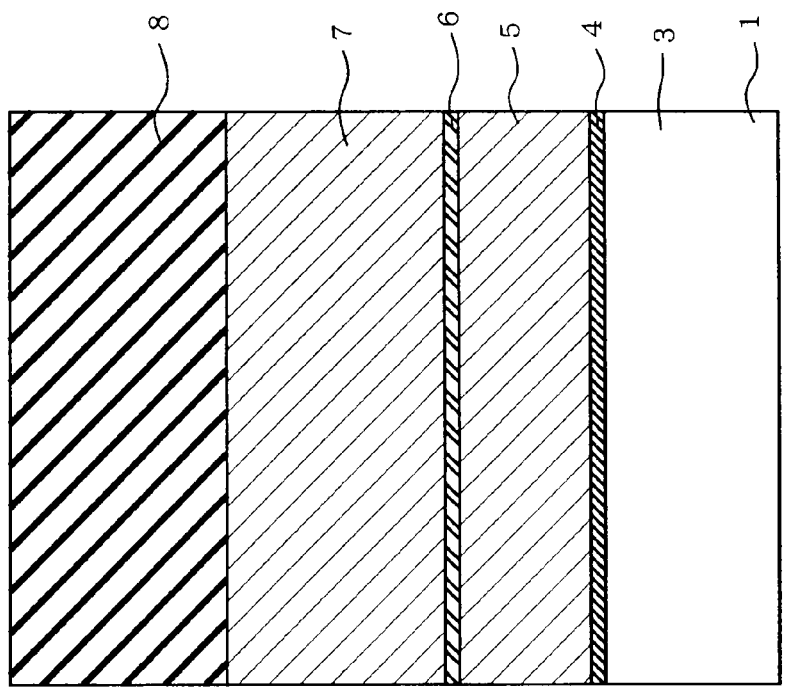

Referring to FIG. 4, layers for forming gate electrodes G and GP are laminated on the silicon substrate 1 respectively. Firstly, a gate insulating film 4 is formed across the entire surface of the silicon substrate 1. The gate insulating film 4 is a silicon oxide film formed by thermal oxidation, for example, and is configured in a thickness to obtain required breakdown voltage. The gate insulating film 4 is formed in a thickness of approximately 8 nm, for example, in the memory cell region, whereas in the peripheral circuit region, it is formed at approximately 8 nm and 35 nm depending upon the required breakdown voltage of the transistor TrP. Then, a polycrystalline silicon film 5 constituting the floating gate electrode is formed in the thickness of approximately 95 nm by CVD (chemical vapor deposition) on the entire surface of the gate insulating film 4. The polycrystalline silicon film is heavily doped with phosphorous (P) or boron (B).

Then, inter-gate insulating film 6 is formed in the thickness of 16 nm by CVD. As described earlier, the inter-gate insulating film 6 employs a film configuration such as ONO film or NONON film. The inter-gate insulating film 6 is formed in the region constituting the gate electrode SG of the select gate transistors Trs1 and Trs2 of the memory cell region and the region constituting the transistor TrP of the peripheral circuit region. An opening 6a is defined in a portion of the inter-gate insulating film 6 to establish electrical connection between the floating gate electrode and the control gate electrode through the opening 6a.

Next, a polycrystalline silicon film 7 for control gate electrode formation is formed on the entire surface of the inter-gate insulating film 6 in the thickness of 165 nm with heavy dope of phosphorous (P) or boron (B). Thereafter, a silicon nitride film 8 serving as a hard mask material is formed on the polycrystalline silicon film 7 by CVD, for example, to obtain the state indicated in FIG. 4.

Next, as illustrated in FIG. 5, the silicon nitride film 8 is etched to form hard masks 8a and 8b. More specifically, a resist pattern (not shown) is formed on the silicon nitride film 8 by photolithography process which in turn is used as a mask to etch the silicon nitride film 8 by RIE to form a hard mask 8a for memory cell transistors, a hard mask 8b for peripheral circuit transistors and a hard mask for transistors not shown.

Figure 6A:
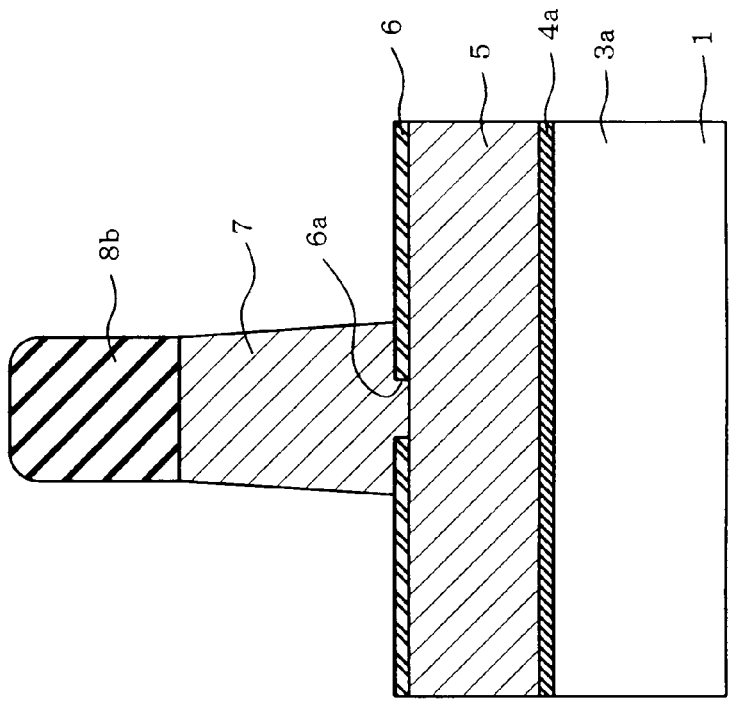
FIGS. 6A and 6B are schematic cross sectional views showing one phase of a manufacturing step ($3^{rd}$ variation)
Figure 6B:
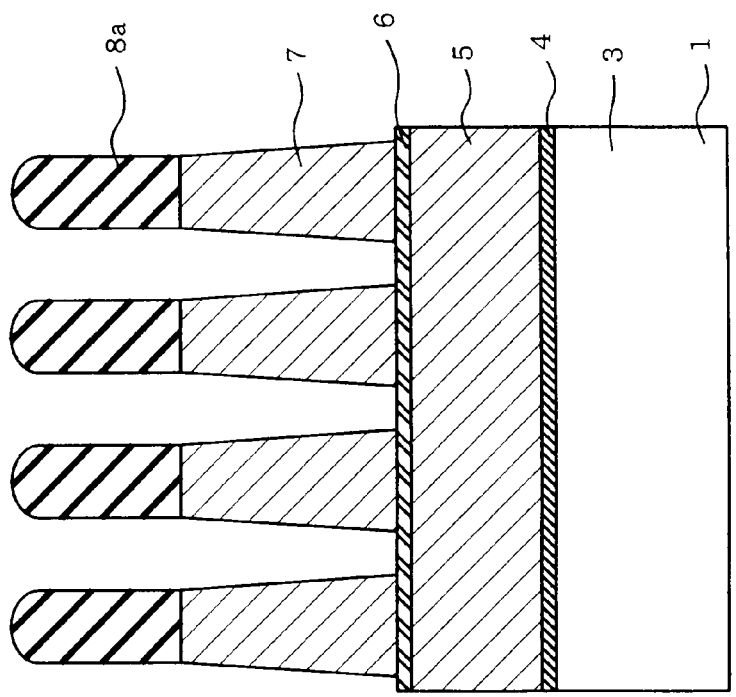

Subsequently, as shown in FIG. 6, the polycrystalline silicon film 7 serving as the control gate constituting the conductive layer is processed by dry etch using the hard masks 8a and 8b as masks. The gas used in the etch is a mixture of the main gas hydrogen bromide (HBr) and fluoromethane based gas ($CH_xF_y$), where x takes a value ranging from 3 to 0, and the x+y=4 equation stands. The four types of gases that satisfy the equation are trifluoromethane gas ($CHF_3$), difluoromethane gas ($CH_2F_2$), fluoromethane gas ($CH_3F$), and tetrafluoromethane gas ($CF_4$). The mixture rate (flow rate) of fluoromethane based gas ($CH_xF_y$) relative to the flow rate of main gas hydrogen bromide (HBr) is specified within the range of 50 to 70% when X=0 (tetrafluoromethane ($CF_4$)), and within 10 to 30% for other gases (trifluoromethane gas ($CHF_3$), difluoromethane gas ($CH_2F_2$), and fluoromethane gas ($CH_3F$)).

When dry etching under the above described conditions, the temperature of the semiconductor substrate (wafer) placed on the chamber cathode is controlled to eliminate the variance in density and increase the taper angles α and β. The temperature of the semiconductor substrate is set to 50 degrees Celsius or higher. In order to attain such temperature, the temperature of the cathode in the chamber may be set between 40 to 100 degrees Celsius. If the gas to be mixed is one or a mixture of trifluoromethane ($CHF_3$), difluoromethane ($CH_2F_2$) and fluoromethane ($CH_3F$), the temperature of the semiconductor substrate is set to 60 degrees Celsius or higher. In order to attain such temperature, the temperature of the cathode in the chamber maybe set between 60 to 100 degrees Celsius. If the gas to be mixed is tetrafluoromethane gas ($CF_4$), the temperature of the semiconductor substrate is controlled in the range of 50 to 70 degrees Celsius. In order to attain such temperature, the temperature of the cathode in the chamber may be set between 50 to 70 degrees Celsius.

Next, as illustrated in FIG. 7, the inter-gate insulating film 6 is processed by dry etch with a fluoride (F) containing gas. When processing of inter-gate insulating film 6 is completed, the polycrystalline silicon film 5 is etched by using the etch condition of the polycrystalline silicon film 7. When the polycrystalline silicon film 5 has been processed to a predetermined thickness, the polycrystalline silicon film 5 etch residues are removed by the mixture of hydrogen bromide gas (HBr), oxygen gas ($O_2$), and nitrogen gas ($N_2$). The resultant configuration is illustrated in FIG. 3.

Steps of gate electrode G processing, active region formation, and interconnecting are executed thereafter to form the NAND flash memory.

FIGS. 8 to 11 depict reduction in pattern dependency when the above described manufacturing steps are employed in etching the polycrystalline silicon films 7 and 5.

Figure 8:
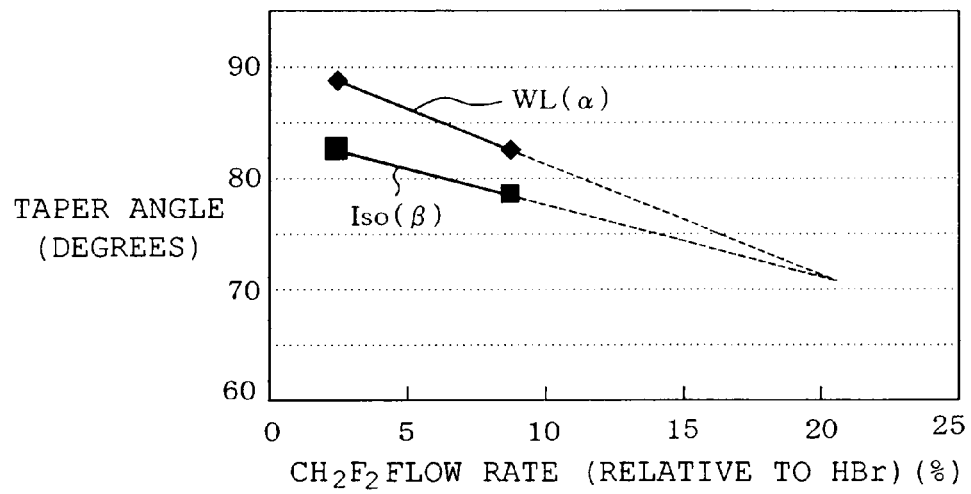
FIG. 8 is a measurement of a relation between a flow rate of additive gas $CH_2F_2$ and a taper angle.
Figure 9:
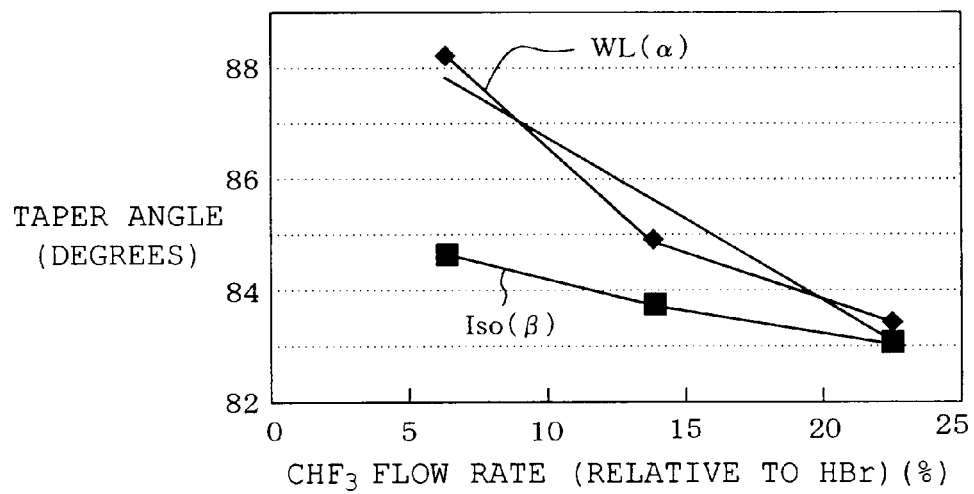
FIG. 9 is a measurement of a relation between a flow rate of additive gas $CHF_3$ and the taper angle.
Figure 10:
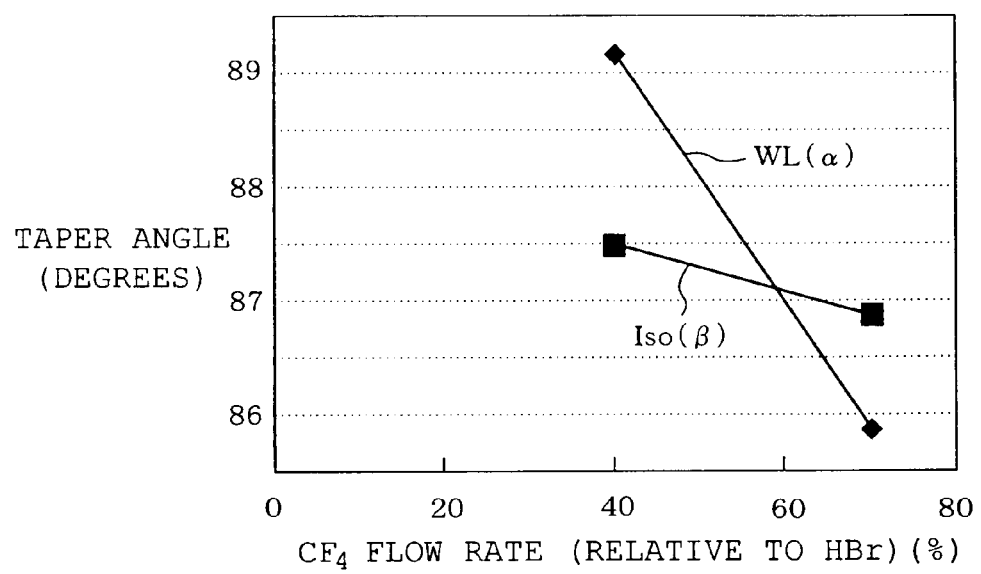
FIG. 10 is a measurement of a relation between a flow rate of additive gas $CF_4$ and the taper angle.

FIGS. 8 to 10 show measurements of taper angles α and β in the dense pattern and the sparse pattern when etching is performed under various flow rates for each additive gas, namely difluoromethane gas ($CH_2F_2$), trifluoromethane gas ($CHF_3$) and tetrafluoromethane gas ($CF_4$). WL indicates the etch result in the word line, which is the most densely patterned region, and Iso indicates the etch results of the isolated portion in the sparsely patterned periphery circuit region.

It can be observed that in either case, the taper angles α and β proximate each other as the flow rate (%) relative to the main gas hydrogen bromide (HBr) becomes greater. It can be observed from FIGS. 8 and 9 that, favorable results can be obtained when flow rates of additive gasses containing hydrogen (H), in other words, difluoromethane ($CH_2F_2$) or trifluoromethane ($CHF_3$) is 10 to 30%, and that most favorable result can be obtained when the flow rate is 20%. In case of employing additive gas which does not contain hydrogen (H), in other words, when tetrafluoromethane ($CF_4$) is employed, favorable results can be obtained when the flow rate is 50 to 70% and the most favorable result can be obtained when the flow rate is 60% as can be seen in FIG. 10.

Figure 11:
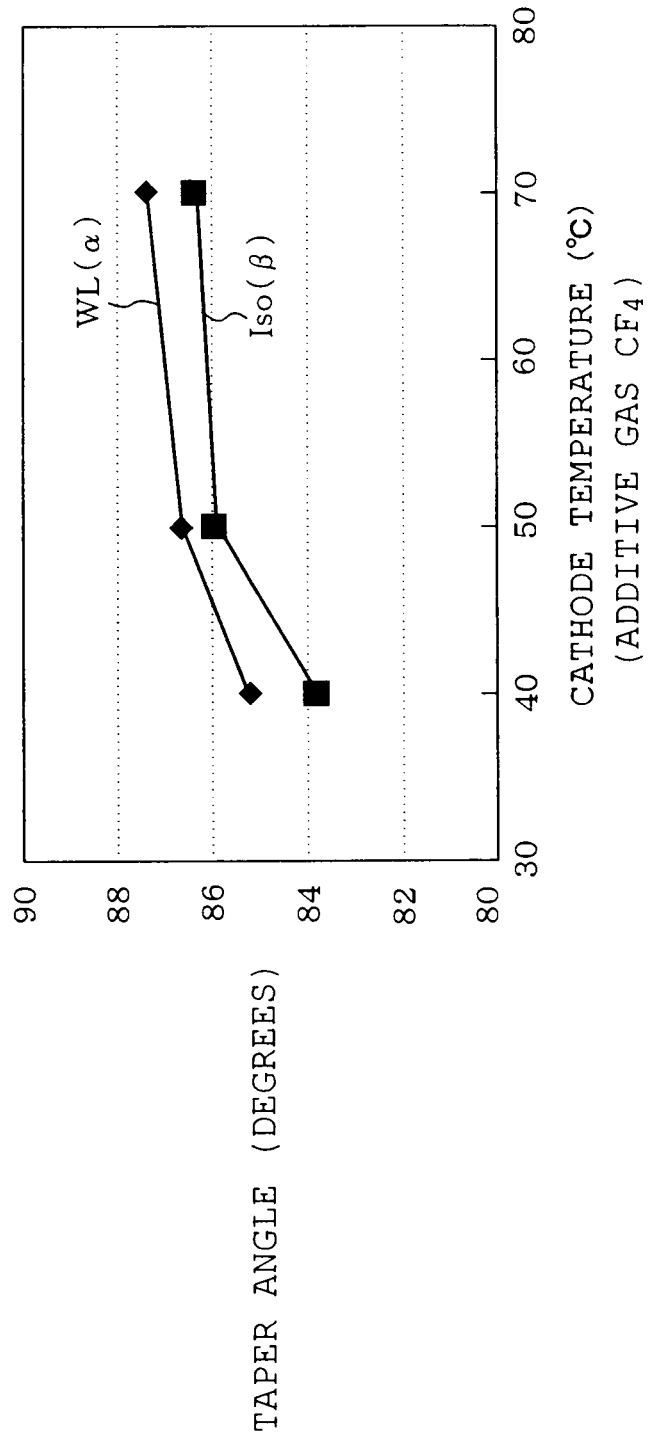
FIG. 11 is a measurement of a relation between a cathode temperature of additive gas $CF_4$ and the taper angle.

FIG. 11 indicates the measurements in case tetrafluoromethane ($CF_4$) is used as additive gas under varying substrate temperatures. It has been found that variation in pattern density can be reduced and the taper angles α and β can be approximated to 90 degrees at higher temperatures. It has been found from these results that taper angles α and β are both increased to take close values especially in the regions at 50 degrees Celsius or higher. Though measurements were taken only up to 70 degrees Celsius because of mechanical limitations, it can be presumed that higher temperatures would also provide favorable results.

According to the present embodiment, one or a combination of four types of additive gas, namely trifluoromethane ($CHF_3$), difluoromethane ($CH_2F_2$), fluoromethane ($CH_3F$), and tetrafluoromethane ($CF_4$) gas is/are employed with the main gas hydrogen bromide gas (HBr) in the etch process, as well as controlling the flow rate of additive gas and the temperature of the semiconductor substrate. This allows execution of favorable etch process with reduced variation in etching results originating from variation in pattern density even in devices having greater magnitude of variation in pattern density such as NAND flash memory.

Variation in etch result originating from variation in the density of the underlying structure can be suppressed especially in case the aspect ratio in the densely patterned region is equal to or greater than 5 and provide improved gate processability.

The present disclosure is not limited to the above embodiments but may be modified or expanded as follows.

A silicon nitride film or an oxinitride film may be employed as a gate insulating film 4 instead of a silicon oxide film. Alternatively, multi-layered film composed of a combination of at least a silicon oxide film and an oxinitride film may be used instead.

High-dielectric material other than ONO film or NONON film may be used as the inter-gate insulating film 6.

Silicon oxide film ($SiO_2$) such as BSG film or TEOS film may be employed as a hard mask material other than the silicon nitride film 8.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A method of manufacturing a semiconductor device, comprising:
    forming a gate insulating film, a first polycrystalline silicon film, an inter-gate insulating film, and a second polycrystalline silicon film one above another in a memory cell region and a peripheral circuit region of a semiconductor substrate;
    forming a silicon nitride film serving as a mask layer above the second polycrystalline silicon film;
    patterning the silicon nitride film located in the memory cell region into a dense pattern and the silicon nitride film located in the peripheral circuit region into a sparse pattern;
    dry etching, while controlling a temperature of the semiconductor substrate placed in an etching chamber at 50 degrees Celsius or higher, the second polycrystalline silicon film, the inter-gate insulating film, and the first polycrystalline silicon film one after another using the dense pattern in the memory cell region and the sparse pattern in the peripheral-circuit region as masks, the second polycrystalline silicon film being dry etched under a first etching condition, the inter-gate insulating film being dry etched under a second etching condition to expose the first polycrystalline silicon film, and the first polycrystalline silicon film being dry etched under the first etching condition to a predetermined thickness; and removing etch residues of the first polycrystalline silicon film by a mixture of a hydrogen bromide (HBr) gas, an oxygen ($O_2$) gas, and a nitrogen ($N_2$) gas;

wherein the first etching condition includes supplying an etching gas composed of a hydrogen bromide gas and a fluoromethane based gas into the chamber, and generating plasma in the chamber, and wherein the supplying comprises supplying at least one of a difluoromethane gas ($CH_2F_2$) and a fluoromethane gas ($CH_3F$) at a flow rate of the fluoromethane based gas relative to that of the hydrogen bromide gas being 10 to 30% so that variation in etching results originating from variation in pattern densities of the first polycrystalline silicon film and the second polycrystalline silicon film in the memory cell region and the peripheral circuit region is reduced to a predetermined amount.

2. The method of claim 1, wherein the dry etching etches the second and first polycrystalline silicon films in the dense pattern in the memory cell region at an aspect ratio of 5 or greater.

3. The method of claim 1, wherein the inter-gate insulating film comprises at least one of or a combination of high-dielectric materials, silicon oxide ($SiO_2$) and silicon nitride (SiN).

4. The method of claim 1, wherein the mask layer further comprise a silicon oxide ($SiO_2$).

5. The method of claim 1, wherein the temperature of the semiconductor substrate is controlled at 50 degrees Celsius or higher by a cathode provided in the etching chamber, the cathode being controlled between 50 to 100 degrees Celsius.

6. The method of claim 1, wherein a cathode provided in the etching chamber is controlled between 60 to 100 degrees Celsius to control the temperature of the semiconductor substrate when one of the difluoromethane gas ($CH_2F_2$) or the fluoromethane gas ($CH_3F$) is added to the hydrogen bromide gas.

* * * * *